(12) United States Patent
Hayashi et al.

(10) Patent No.: US 8,941,121 B2
(45) Date of Patent: Jan. 27, 2015

(54) SILICON CARBIDE SEMICONDUCTOR DEVICE AND METHOD FOR MANUFACTURING SILICON CARBIDE SEMICONDUCTOR DEVICE

(71) Applicant: Sumitomo Electric Industries, Ltd., Osaka-shi (JP)

(72) Inventors: Hideki Hayashi, Osaka (JP); Takeyoshi Masuda, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 13/736,432

(22) Filed: Jan. 8, 2013

(65) Prior Publication Data

US 2013/0207124 A1 Aug. 15, 2013

Related U.S. Application Data

(60) Provisional application No. 61/598,037, filed on Feb. 13, 2012.

(30) Foreign Application Priority Data

Feb. 13, 2012 (JP) ................................. 2012-027935

(51) Int. Cl.
*H01L 29/16* (2006.01)
*H01L 29/66* (2006.01)
(Continued)

(52) U.S. Cl.
CPC ...... *H01L 29/1608* (2013.01); *H01L 29/66666* (2013.01); *H01L 29/66068* (2013.01); *H01L 29/7802* (2013.01); *H01L 29/7813* (2013.01); *H01L 29/0634* (2013.01);
(Continued)

(58) Field of Classification Search
USPC ..................... 257/77, 327, 341, E29.104, 330
See application file for complete search history.

(56) References Cited

U.S. PATENT DOCUMENTS

| 7,368,783 B2 | 5/2008 | Mizukami et al. |
| 2005/0006699 A1 | 1/2005 | Sato et al. |

(Continued)

FOREIGN PATENT DOCUMENTS

JP 2004-342660 A 12/2004

OTHER PUBLICATIONS

Hayashi et al., U.S. Appl. No. 13/736,582, filed Jan. 8, 2013.
(Continued)

*Primary Examiner* — Yasser A Abdelaziez
*Assistant Examiner* — Rodolfo Fortich
(74) *Attorney, Agent, or Firm* — Venable LLP; Steven L. Schwarz; Tamatane J. Aga

(57) ABSTRACT

A first region of a silicon carbide layer constitutes a first surface, and is of a first conductivity type. A second region is provided on the first region, and is of a second conductivity type. A third region is provided on the second region, and is of the first conductivity type. A fourth region is provided in the first region, located away from each of the first surface and the second region, and is of the second conductivity type. A gate insulation film is provided on the second region so as to connect the first region with the third region. A gate electrode is provided on the gate insulation film. A first electrode is provided beneath the first region. A second electrode is provided on the third region.

8 Claims, 13 Drawing Sheets

(51) Int. Cl.
*H01L 29/78* (2006.01)
*H01L 29/06* (2006.01)
*H01L 21/3065* (2006.01)
*H01L 21/308* (2006.01)
*H01L 29/423* (2006.01)
*H01L 29/04* (2006.01)

(52) U.S. Cl.
CPC ....... *H01L 21/3065* (2013.01); *H01L 21/3081* (2013.01); *H01L 29/4236* (2013.01); *H01L 29/045* (2013.01); *H01L 29/0696* (2013.01)
USPC ............. 257/77; 438/285; 438/306; 438/510; 438/663; 438/270

(56) References Cited

U.S. PATENT DOCUMENTS

2010/0059814 A1\* 3/2010 Loechelt et al. .............. 257/330
2010/0285647 A1 11/2010 Ueno
2011/0297963 A1\* 12/2011 Honaga et al. ................. 257/77

OTHER PUBLICATIONS

Notice of Allowance in U.S. Appl. No. 13/736,582, dated Dec. 23, 2013.

\* cited by examiner

SILICON CARBIDE SEMICONDUCTOR DEVICE AND METHOD FOR MANUFACTURING SILICON CARBIDE SEMICONDUCTOR DEVICE

BACKGROUND OF THE INVENTION

1. Field of the Invention

The present invention relates to a silicon carbide semiconductor device and a method for manufacturing a silicon carbide semiconductor device. More particularly, the present invention relates to a silicon carbide semiconductor device having a gate electrode, and a method for manufacturing the silicon carbide semiconductor device.

2. Description of the Background Art

It is known that there is a trade-off generally between the ON resistance and breakdown voltage in a semiconductor device for electric power. In recent years, there has been proposed a semiconductor device having a charge compensation structure such as a super junction structure for the purpose of improving the breakdown voltage while suppressing ON resistance. For example, Japanese Patent Laying-Open No. 2004-342660 discloses a power MOSFET (Metal Oxide Semiconductor Field Effect Transistor) having a charge compensation structure.

According to the art in the aforementioned publication, a $p^+$ type base layer functioning as a channel is formed on a p-type pillar layer (charge compensation structure). Therefore, the impurities in the charge compensation structure will affect the channel property.

SUMMARY OF THE INVENTION

The present invention is directed to solve the aforementioned problem. An object of the present invention is to provide a silicon carbide semiconductor device that can have breakdown voltage improved while avoiding influence to the channel property and suppressing ON resistance, and a method for manufacturing the silicon carbide semiconductor device.

A silicon carbide semiconductor device of the present invention includes a silicon carbide layer, a gate insulation film, a gate electrode, a first electrode, and a second electrode. The silicon carbide layer includes a first surface and a second surface opposite to each other in a thickness direction. The silicon carbide layer includes a first region, a second region, a third region, and a fourth region. The first region constitutes the first surface, and is of a first conductivity type. The second region is provided on the first region so as to be apart from the first surface by the first region, and is of a second conductivity type differing from the first conductivity type. The third region is provided on the second region, isolated from the first region by the second region, and is of the first conductivity type. The fourth region is provided in the first region, located away from each of the first surface and the second region, and is of the second conductivity type. The gate insulation film is provided on the second region to connect the first region with the third region. The gate electrode is provided on the gate insulation film. The first electrode is provided beneath the first region. The second electrode is provided on the third region.

According to the present device, at least a portion of the electric field in the thickness direction caused by fixed charge of one of the positive and negative polarity generated by depletion of the first region is compensated for by the fixed charge of the other polarity generated by depletion of the fourth region. In other words, a charge compensation structure is provided. Accordingly, the maximum value of the electric field intensity in the thickness direction is suppressed. Therefore, the breakdown voltage of the silicon carbide semiconductor device can be improved. According to the present device, the fourth region is located away from the second region. Accordingly, the event of the impurities in the fourth region affecting the second region functioning as the channel can be avoided.

Preferably, the fourth region has a thickness greater than 5 μm in the thickness direction. Accordingly, the charge compensation structure is provided over a larger range in the thickness direction. Thus, the breakdown voltage of the silicon carbide semiconductor device can be further improved.

Preferably at the second surface, there is provided a gate trench having a sidewall, passing through the third and second regions up to the first region, and located away from the fourth region. The gate insulation film is provided on the sidewall. Accordingly, the charge compensation structure can be applied to a trench type semiconductor device.

Preferably, the sidewall of the gate trench is oblique to the second surface of the silicon carbide layer by an angle greater than 0° and smaller than 90°. Accordingly, a channel plane having a plane orientation oblique to the second surface can be provided.

Preferably, the angle of the side face of the fourth region relative to the thickness direction is small as compared to the angle of the sidewall of the gate trench relative to the thickness direction. Accordingly, the charge compensation by virtue of the fourth region can be effected more sufficiently.

Preferably, the silicon carbide layer has a crystal structure of hexagonal system. The sidewall of the gate trench of the silicon carbide layer includes a region constituted of at least one of a {0-33-8} plane and {0-11-4} plane. Accordingly, the carrier mobility on the sidewall can be increased. Therefore, the ON resistance of the silicon carbide semiconductor device can be suppressed.

A method for manufacturing a silicon carbide semiconductor device of the present invention includes the steps set forth below. A silicon carbide layer having a first surface and a second surface opposite to each other in a thickness direction is prepared. The silicon carbide layer includes a first region, a second region, a third region, and a fourth region. The first region constitutes the first surface, and is of a first conductivity type. The second region is provided on the first region apart from the first surface by the first region, and is of a second conductivity type differing from the first conductivity type. The third region is provided on the second region, isolated from the first region by the second region, and is of the first conductivity type. The fourth region is provided in the first region, located away from each of the first surface and the second region, and is of the second conductivity type. A gate trench having a sidewall, passing through the third and second regions up to the first region, and located away from the fourth region is formed at the second surface. A gate insulation film is formed on the sidewall of the gate trench. A gate electrode is formed on the gate insulation film. A first electrode is formed beneath the first region of the silicon carbide layer. A second electrode is formed on the third region of the silicon carbide layer.

According to the silicon carbide semiconductor device obtained by the present manufacturing method, at least a portion of the electric field in the thickness direction caused by fixed charge of one of the positive and negative polarity generated by depletion of the first region is compensated for by the fixed charge of the other polarity generated by depletion of the fourth region. In other words, a charge compensation structure is provided. Accordingly, the maximum value of the electric field intensity in the thickness direction is suppressed. Therefore, the breakdown voltage of the silicon carbide semiconductor device can be improved. According to the present manufacturing method, the fourth region is located away from the second region. Accordingly, the event of the impurities in the fourth region affecting the second region functioning as a channel can be avoided.

Preferably, the gate trench is formed using thermal etching. Accordingly, the plane orientation of the sidewall of the gate trench can be set to a specific one crystallographically.

Preferably, the step of preparing a silicon carbide layer includes the following steps. A base portion constituting the first surface and partially constituting the first region is prepared. The fourth region is formed by epitaxial-growth on the base portion. A through portion exposing a portion of the base portion is formed at the fourth region. An embedding portion partially constituting the first region and filling the through portion of the fourth region, and a cover portion partially constituting the first region and covering the embedding portion and the base portion are formed. The second region and third region are formed on the cover portion. Accordingly, a portion passing through the fourth region can be provided at the first region.

Preferably, the through portion can be formed through etching having a physical etching action. Accordingly, the etching directed to forming a through portion can be carried out more perpendicularly. Therefore, the side face of the fourth region, constituting the inner face of the through portion can be set along the thickness direction. Thus, the charge compensation by virtue of the fourth region can be effected more sufficiently.

In the description above, the recitation of "on the first region of the silicon carbide layer" may imply any of "directly on" and "indirectly on" the first region.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
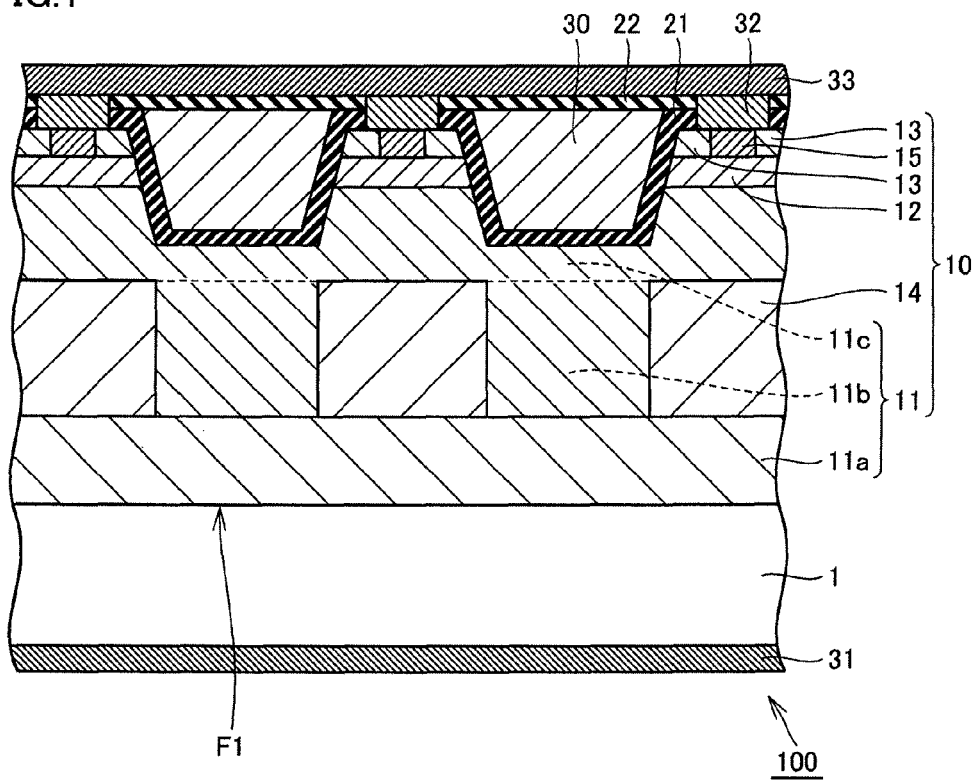
FIG. 1 is a partial sectional view schematically representing a configuration of a silicon carbide semiconductor device according to a first embodiment of the present invention.

Embodiments of the present invention will be described hereinafter based on the drawings. In the drawings set forth below, the same or corresponding elements have the same reference characters allotted, and description thereof will not be repeated. As to the crystallographic notation in the present specification, a specific plane is represented by ( ), whereas a group of equivalent planes is represented by { }. For a negative index, a bar (–) is typically allotted above a numerical value in the crystallographic aspect. However, in the present specification, a negative sign will be attached before the numerical value.

First Embodiment

First, a structure of an MOSFET 100 (silicon carbide semiconductor device) according to the present embodiment will be described with reference to FIGS. 1-5.

As shown in FIG. 1, MOSFET 100 includes a single crystal substrate 1, a SiC layer 10 (silicon carbide layer), a drain electrode 31 (first electrode), a source electrode 32 (second electrode), a gate oxide film 21 (gate insulation film), an interlayer insulation film 22, a gate electrode 30, and a source interconnection layer 33.

Single crystal substrate 1 is made of silicon carbide of the n-type (first conductivity type). For example, single crystal substrate 1 is formed of silicon carbide having a single crystal structure of either hexagonal system or cubic system. Preferably, a main surface (the top face in the drawing) having an off angle within 5 degrees from the reference plane is provided at single crystal substrate 1. The reference plane is the {000-1} plane, more preferably the (000-1) plane, for the hexagonal system. For the cubic system, the reference plane is the {111} plane. Preferably, the off angle is greater than or equal to 0.5 degrees.

Figure 2:
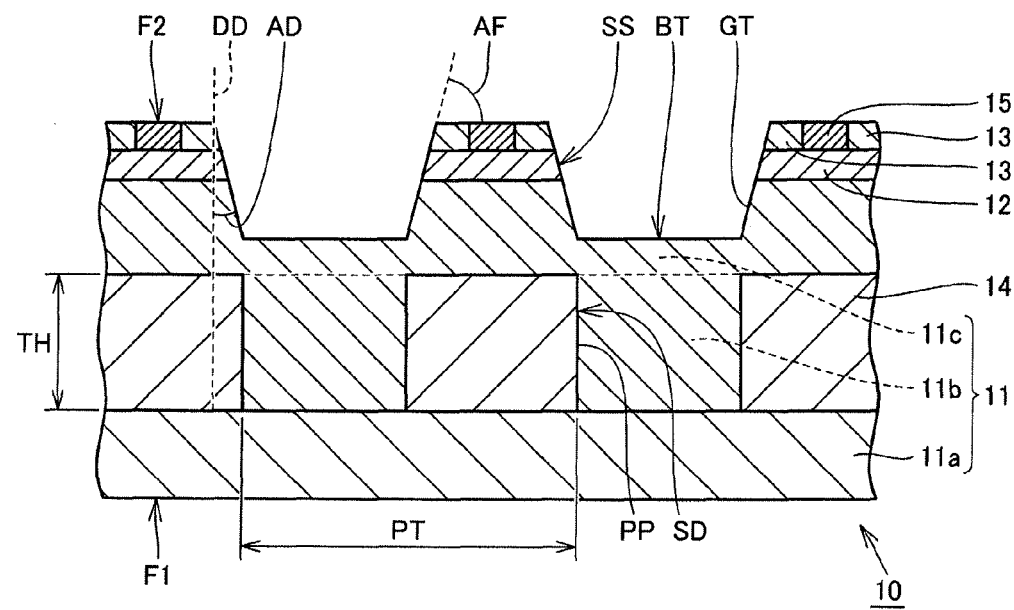
FIG. 2 is a partial sectional view taken along line II-II in each of FIGS. 3-5, schematically representing a configuration of a silicon carbide layer in the silicon carbide semiconductor device of FIG. 1.
Figure 3:
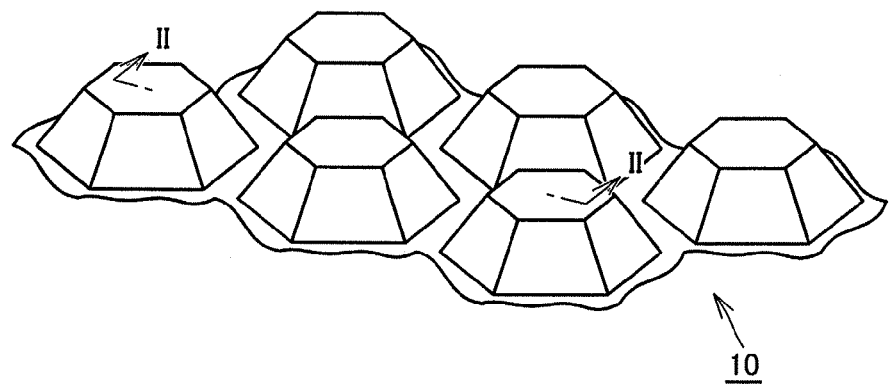
FIGS. 3 and 4 are a partial perspective view and a partial plan view, respectively, schematically representing a configuration of the silicon carbide layer in FIG. 2.

Further referring to FIGS. 2-5, SiC layer 10 has a lower face F1 (first surface) and an upper face F2 (second surface) opposite to each other in the thickness direction DD (FIG. 2). Lower face F1 and upper face F2 are substantially parallel to each other. SiC layer 10 includes an n⁻ drift region 11 (first region), a p region 12 (second region), an n region 13 (third region), a charge compensation region 14 (fourth region), and a p⁺ contact region 15.

N⁻ drift region 11 constitutes lower face F1, and is of the n-type (first conductivity type. N⁻ drift region 11 includes a base portion 11a, an embedding portion 11b, and a cover portion 11c. Base portion 11a constitutes lower face F1 of SiC layer 10. Charge compensation region 14 is provided on base portion 11a. Charge compensation region 14 includes a through portion PP connecting base portion 11a with cover portion 11c. A pitch PT of through portion PP is preferably identical to the pitch of gate trench GT that will be described afterwards. Embedding portion 11b fills through portion PP of charge compensation region 14. Cover portion 11c covers embedding portion 11b and base portion 11a. P region 12 is provided on cover portion 11c. Each of base portion 11a, embedding portion 11b and cover portion 11c is formed of the same material with the same impurity concentration.

P region 12 is provided on cover portion 11c of n⁻ drift region 11, and is of the p-type (the second conductivity type differing from the first conductivity type). N region 13 is provided on p region 12, isolated from n⁻ drift region 11 by p region 12, and is of the n-type (first conductivity type).

At upper face F2 is provided a gate trench GT having a bottom BT and a sidewall SS, passing through n region 13 and p region 12 up to n⁻ drift region 11. Gate trench GT is located away from charge compensation region 14. Sidewall SS includes a region constituted of each of n⁻ drift region 11, p region 12, and n region 13. The impurity concentration of n⁻ drift region 11 is preferably greater than or equal to $5 \times 10^{15}$ cm⁻³ and less than or equal to $5 \times 10^{17}$ cm⁻³, more preferably greater than or equal to $5 \times 10^{15}$ cm⁻³ and less than or equal to $5 \times 10^{16}$ cm⁻³.

Charge compensation region 14 is of the p-type (the second conductivity type). Charge compensation region 14 is provided in n⁻ drift region 11, located away from each of lower face F1 and p region 12. Specifically, charge compensation region 14 is isolated from lower face F1 by base portion 11c of n⁻ drift region 11, and isolated from p region 12 by cover portion 11c of n⁻ drift region 11. Charge compensation region 14 has a thickness TH (FIG. 2) greater than 5 μm in thickness direction DD. The impurity concentration of charge compensation region 14 is preferably greater than or equal to $5 \times 10^{15}$ cm⁻³ and less than or equal to $5 \times 10^{17}$ cm⁻³, more preferably greater than or equal to $5 \times 10^{15}$ cm⁻³ and less than or equal to $5 \times 10^{16}$ cm⁻³.

P⁺ contact region 15 is directly provided on a portion of p region 12, and constitutes a portion of upper face F2 of SiC layer 10.

Gate oxide film 21 is provided on p region 12 so as to connect n⁻ drift region 11 with n region 13. Specifically, gate oxide film 21 covers p region 12 of SiC layer 10 on sidewall SS. Gate electrode 30 is provided on gate oxide film 21. Accordingly, gate electrode 30 is located on p region 12 of SiC layer 10 with gate oxide film 21 therebetween.

Drain electrode 31 is an ohmic electrode provided on base portion 11a of n⁻ drift region 11 of SiC layer 10 with single crystal substrate 1 therebetween. Source electrode 32 is an ohmic electrode directly provided on n region 13 and p⁺ contact region 15 of SiC layer 10.

Preferably, sidewall SS of gate trench GT is oblique relative to upper face F2 of SiC layer 10 by just an angle AF (FIG. 2) greater than 0° and smaller than 90°. More preferably, the angle of a side face SD (FIG. 2) of charge compensation region 14 relative to thickness direction DD is smaller as compared to an angle AD (FIG. 2) of sidewall SS of gate trench GT relative to thickness direction DD.

SiC layer 10 may have a crystal structure of hexagonal system. In this case, sidewall SS of gate trench GT of SiC layer 10 preferably includes a region constituted of at least one of a {0-33-8} plane and {0-11-4} plane. SiC layer 10 may have a crystal structure of cubic system. In this case, sidewall SS of gate trench GT of SiC layer 10 preferably includes a region constituted of the {100} plane.

A method for manufacturing MOSFET 100 will be described hereinafter.

Figure 6:
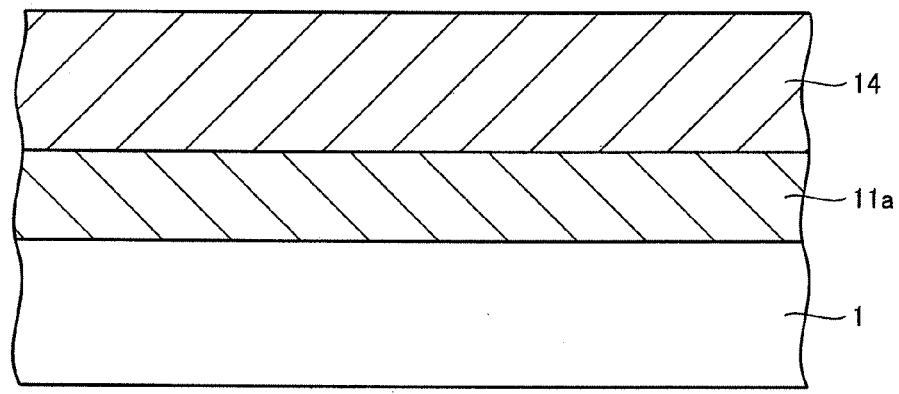
FIG. 6 is a partial sectional view schematically representing a first step in a method for manufacturing a silicon carbide semiconductor device according to the first embodiment of the present invention.

As shown in FIG. 6, base portion 11a that will constitute a portion of n⁻ drift region 11 (not shown in FIG. 6) is formed by epitaxial-growth of silicon carbide on single crystal substrate 1. Then, charge compensation region 14 is formed by epitaxial-growth on base portion 11a. Epitaxial-growth of silicon carbide can be carried out by chemical vapor deposition (CVD) using mixture gas of silane ($SiH_4$) and propane ($C_3H_8$) as the raw material gas and hydrogen gas ($H_2$) as the carrier gas. Silicon carbide can be doped n-type by using nitrogen (N) or phosphorus (P), for example, for the impurities. Silicon carbide can be doped p-type by using aluminium (Al), for example, for the impurities.

Figure 7:
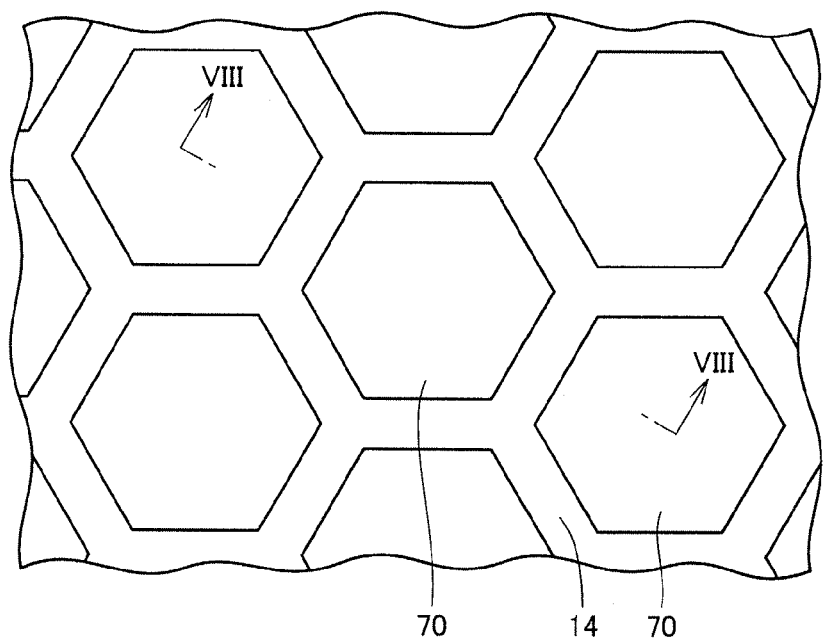
FIG. 7 is a partial plan view schematically representing a second step in the method for manufacturing a silicon carbide semiconductor device according to the first embodiment of the present invention.
Figure 8:
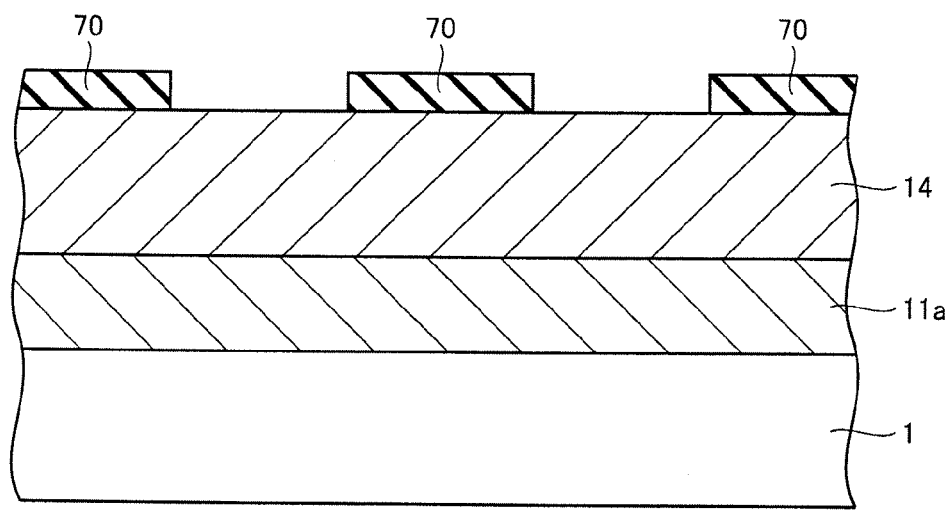
FIG. 8 is a schematic partial sectional view taken along line VIII-VIII in FIG. 7.

As shown in FIGS. 7 and 8, a mask layer 70 is formed on charge compensation region 14. Mask layer 70 has an opening corresponding to the position of through portion PP (FIG. 2) in charge compensation region 14. Mask layer 70 is formed of silicon oxide ($SiO_2$), for example.

Figure 9:
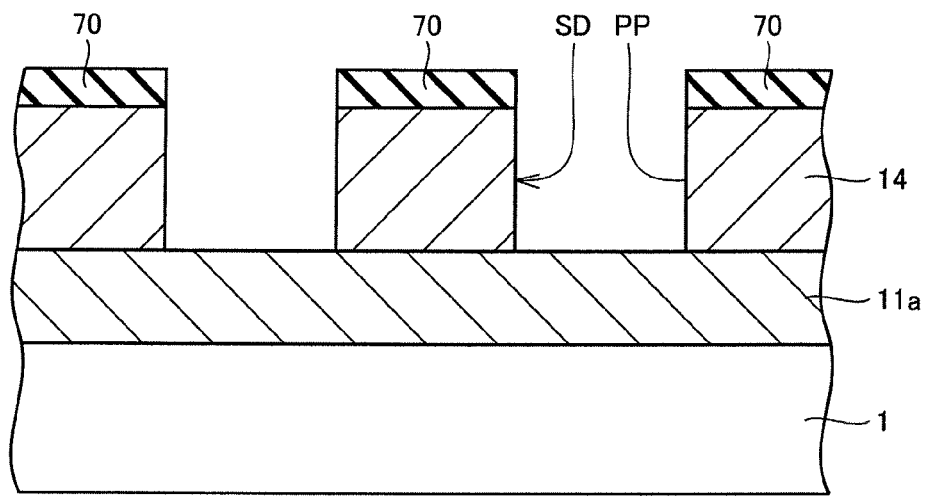
FIGS. 9-12 are partial sectional views schematically representing third to sixth steps, respectively, in the method for manufacturing a silicon carbide semiconductor device according to the first embodiment of the present invention.
Figure 10:
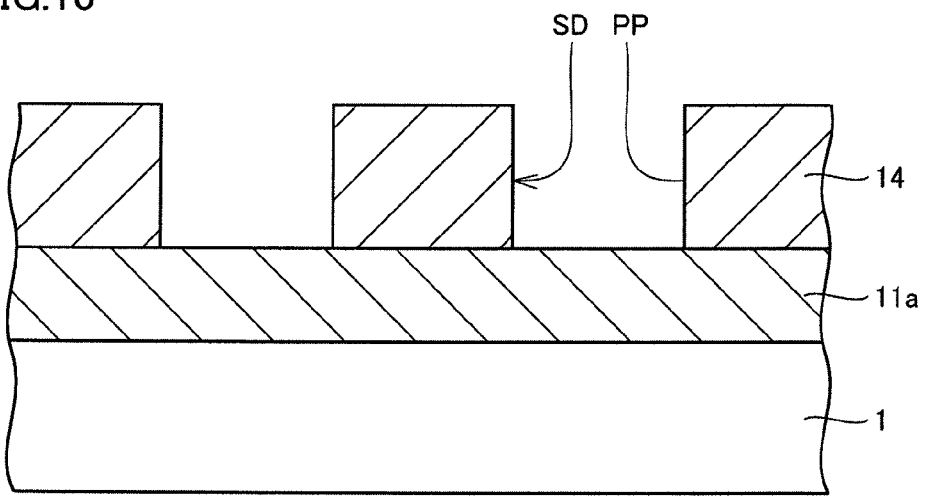

As shown in FIG. 9, through portion PP exposing a portion of base portion 11a is formed at charge compensation region 14 by etching using mask layer 70. Preferably, this etching is carried out through etching having a physical etching action. For such etching, reactive ion etching (RIE) or ion beam etching (IBE), for example, can be cited. Particularly, inductive coupling plasma (ICP) RIE can be used for RIE. Specifically, ICP-RIE using $SF_6$ or mixture gas of $SF_6$ and $O_2$ as the reaction gas can be employed. Then, mask layer 70 is removed (FIG. 10).

Figure 11:
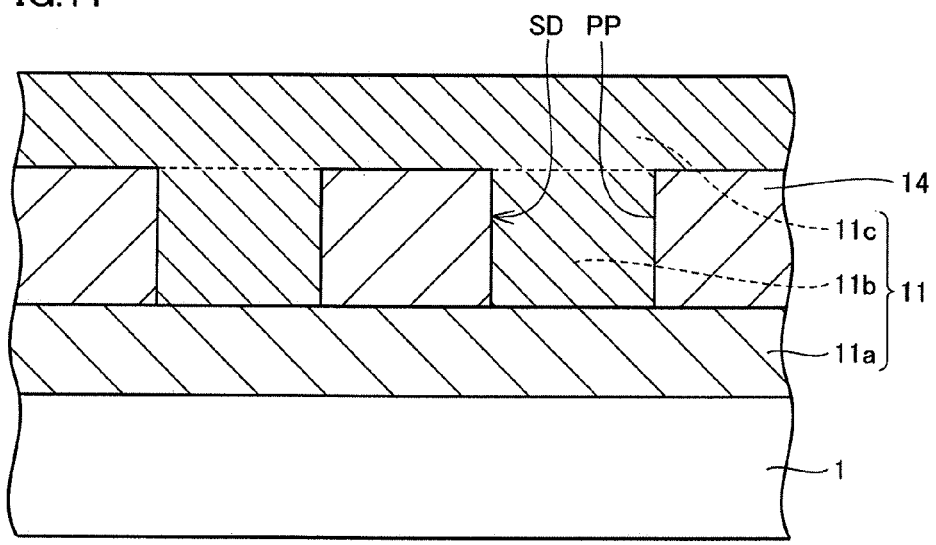

As shown in FIG. 11, embedding portion 11b and cover portion 11c that will constitute a portion of n⁻ drift region 11 (not shown in FIG. 11) are formed. Specifically, embedding portion 11b filling through portion PP of charge compensation region 14 is formed. Further, cover portion 11c covering embedding portion 11b and base portion 11a is formed. For the forming method, a method similar to that of base portion 11a may be employed.

Figure 12:
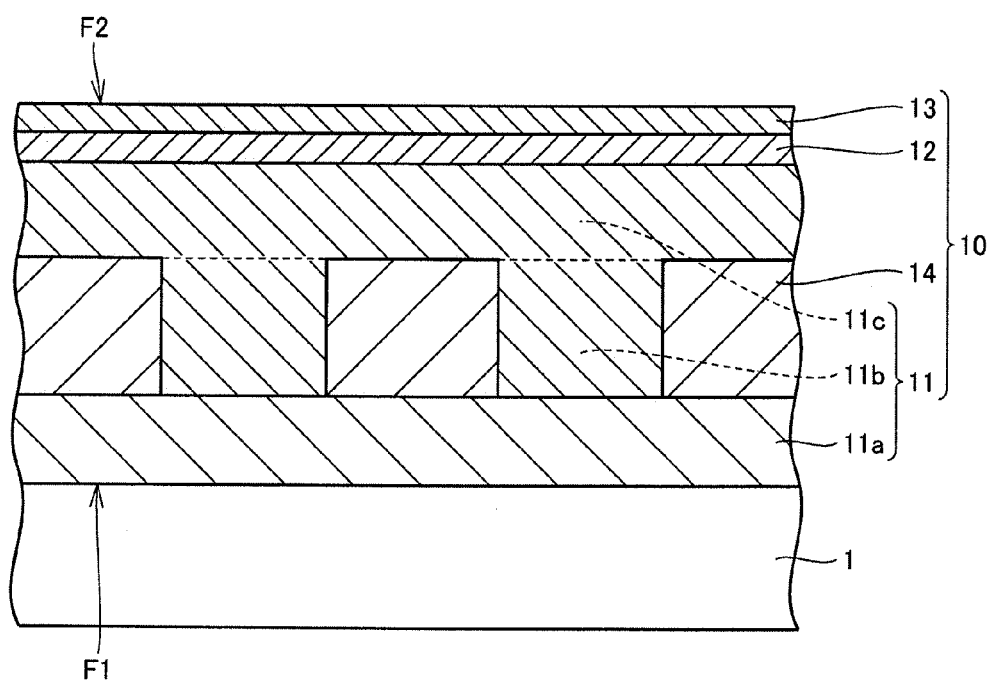

As shown in FIG. 12, p region 12 and n region 13 are formed on cover portion 11c. Specifically, ion implantation is carried out on the top surface layer of cover portion 11c of n⁻ drift region 11 to form p region 12 and n region 13. The portion not subjected to ion implantation remains as cover portion 11c. By adjusting the acceleration energy of ions to be implanted, the region where p region 12 is formed can be adjusted. In the impurity ion implantation for p-type doping, aluminium (Al), for example, is employed as the impurity. In impurity ion implantation for n-type doping, phosphorus (P), for example, is employed as the impurity. At least one of p region 12 and n region 13 may be formed by epitaxial-growth, instead of by ion implantation.

Thus, SiC layer 10 is formed on single crystal substrate 1. SiC layer 10 has lower face F1 and upper face F2 opposite to each other in the thickness direction (the vertical direction in the drawing). Lower face F1 faces single crystal substrate 1.

Figure 13:
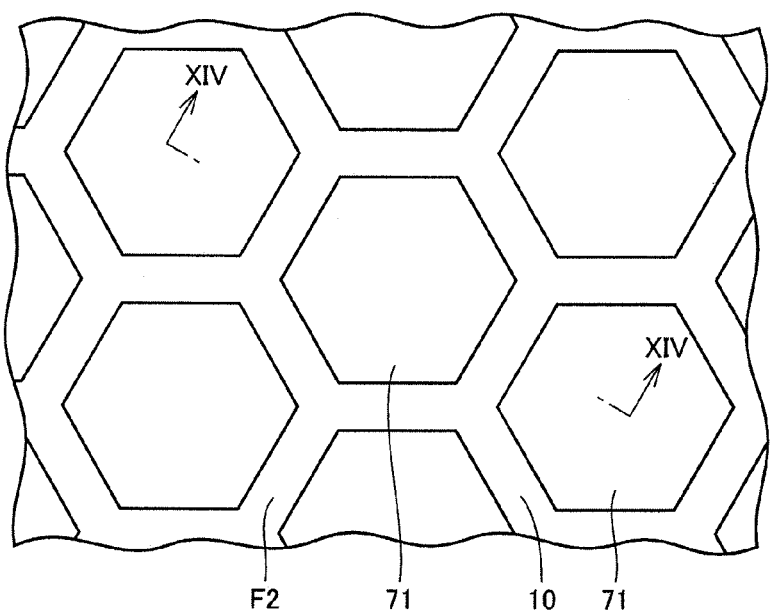
FIG. 13 is a partial plan view schematically representing a seventh step in the method for manufacturing a silicon carbide semiconductor device according to the first embodiment of the present invention.
Figure 14:
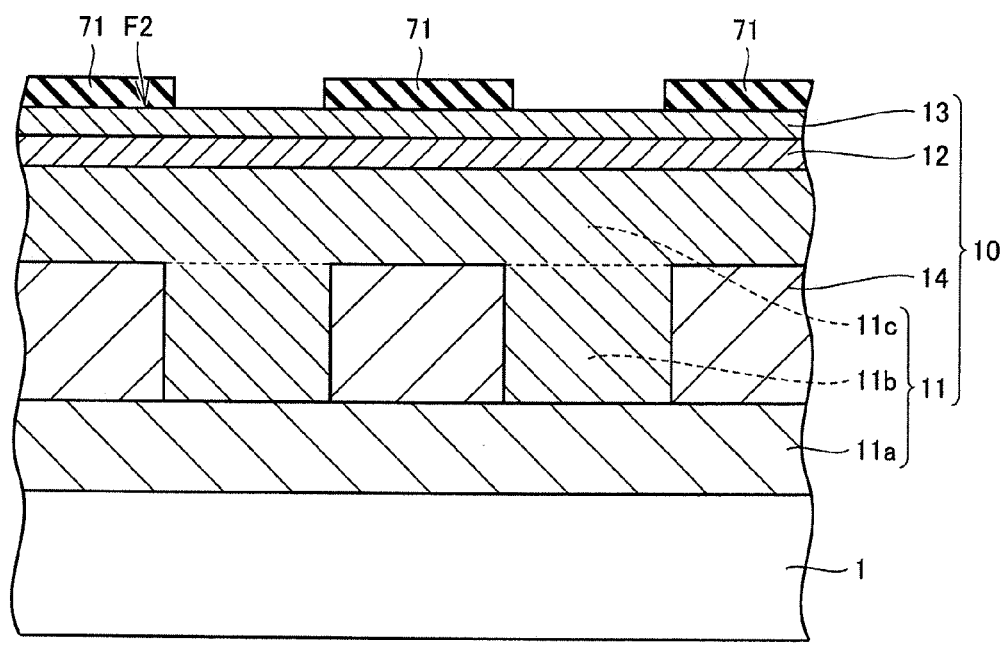
FIG. 14 is a schematic partial sectional view taken along line XIV-XIV in FIG. 13.

As shown in FIGS. 13 and 14, mask layer 71 is formed on upper face F2 of SiC layer 10. Mask layer 71 includes an opening corresponding to the site where gate trench GT (FIG. 1) is to be formed. Mask layer 71 is made of silicon oxide ($SiO_2$), for example.

Figure 15:
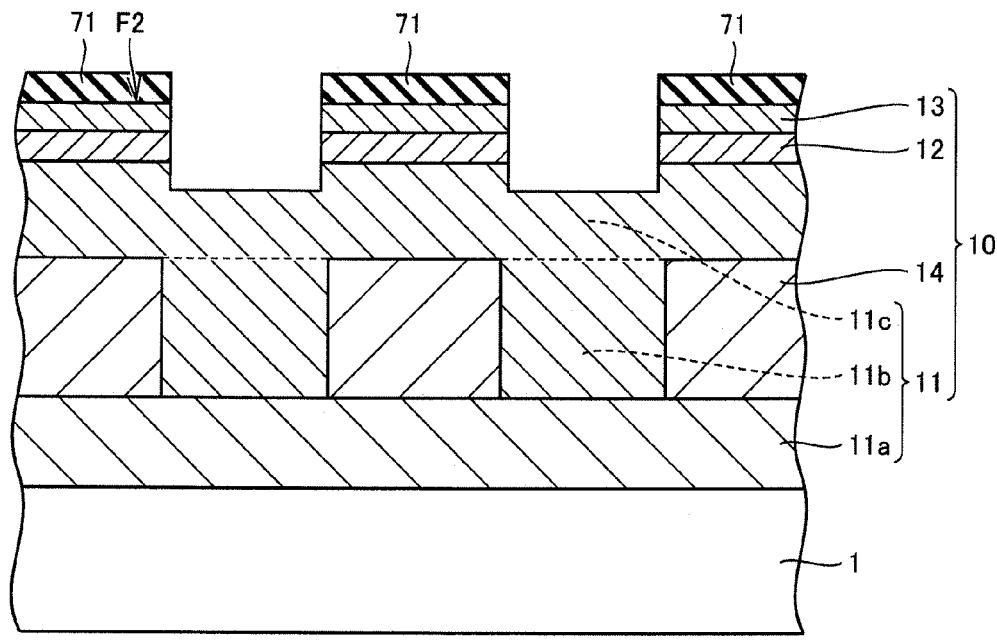
FIG. 15 is a partial sectional view schematically representing an eighth step in the method for manufacturing a silicon carbide semiconductor device according to the first embodiment of the present invention.

As shown in FIG. 15, by etching using mask layer 71, a recess is formed on upper face F2 of SiC layer 10 at the opening of mask layer 71. Preferably this etching is carried out through etching having a physical etching action.

Figure 16:
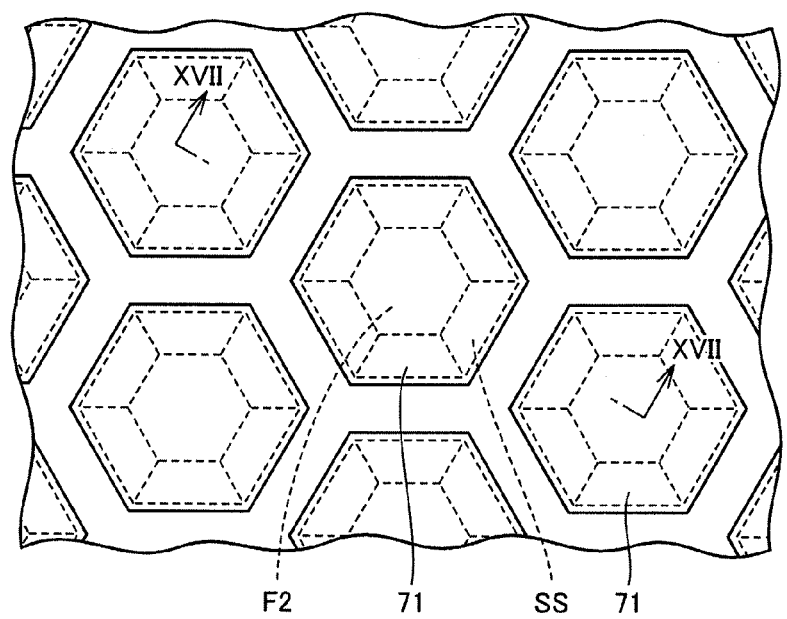
FIG. 16 is a partial plan view schematically representing a ninth step in the method for manufacturing a silicon carbide semiconductor device according to the first embodiment of the present invention.
Figure 17:
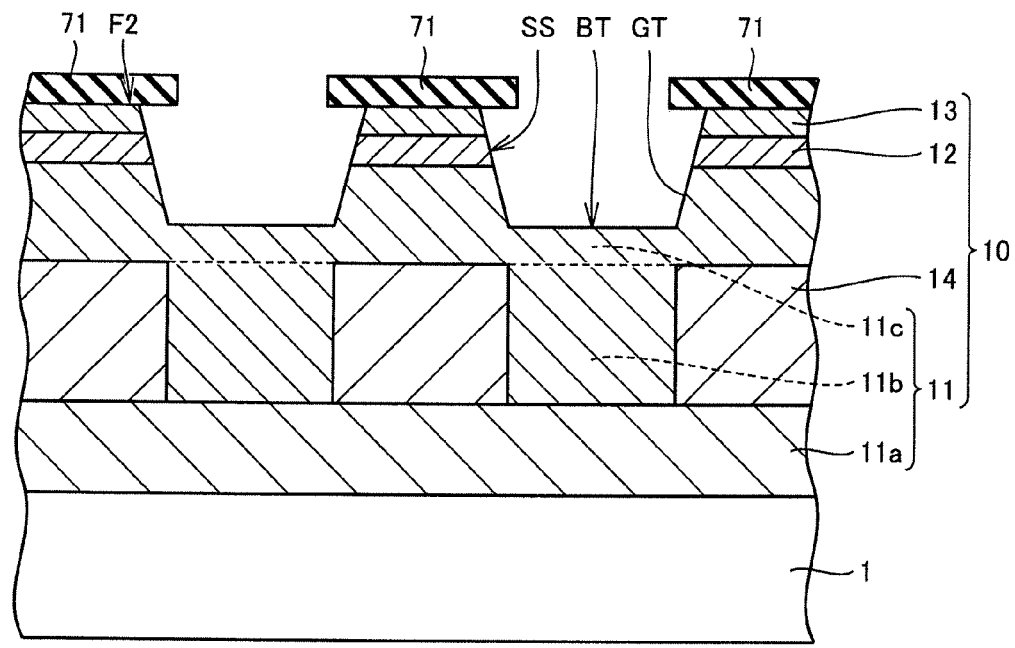
FIG. 17 is a schematic partial sectional view taken along line XVII-XVII in FIG. 16.
Figure 18:
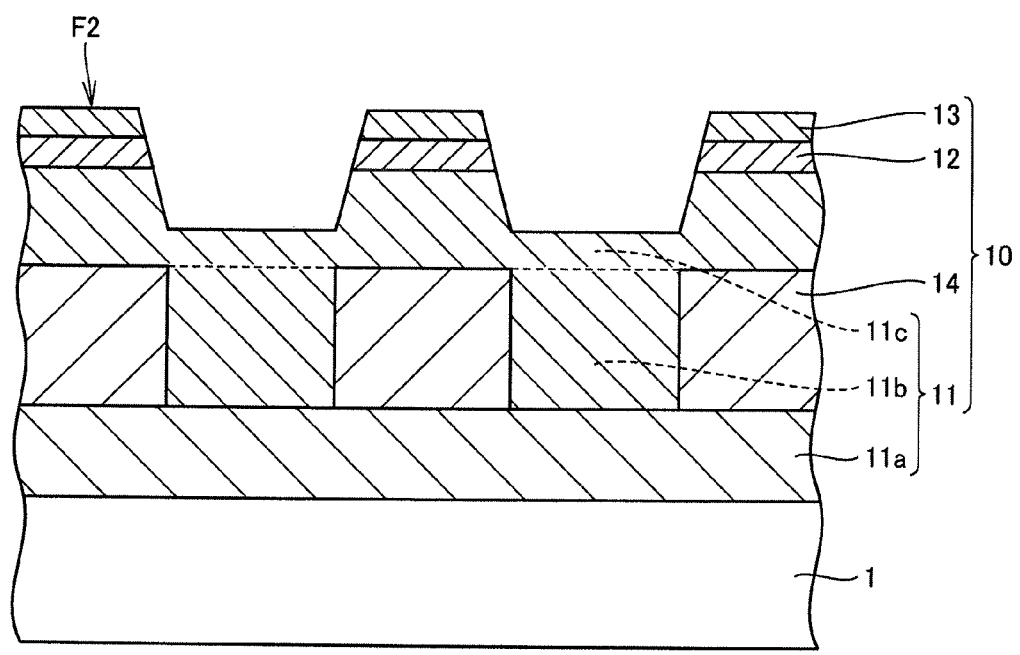
FIGS. 18-22 are partial sectional views schematically representing tenth to fourteenth steps, respectively, in the method for manufacturing a silicon carbide semiconductor device according to the first embodiment of the present invention.

As shown in FIGS. 16 and 17, gate trench GT is formed at upper face F2 by thermal etching of SiC layer 10 using mask layer 71. The details of thermal etching will be described afterwards. Then, mask layer 71 is removed (FIG. 18).

Figure 19:
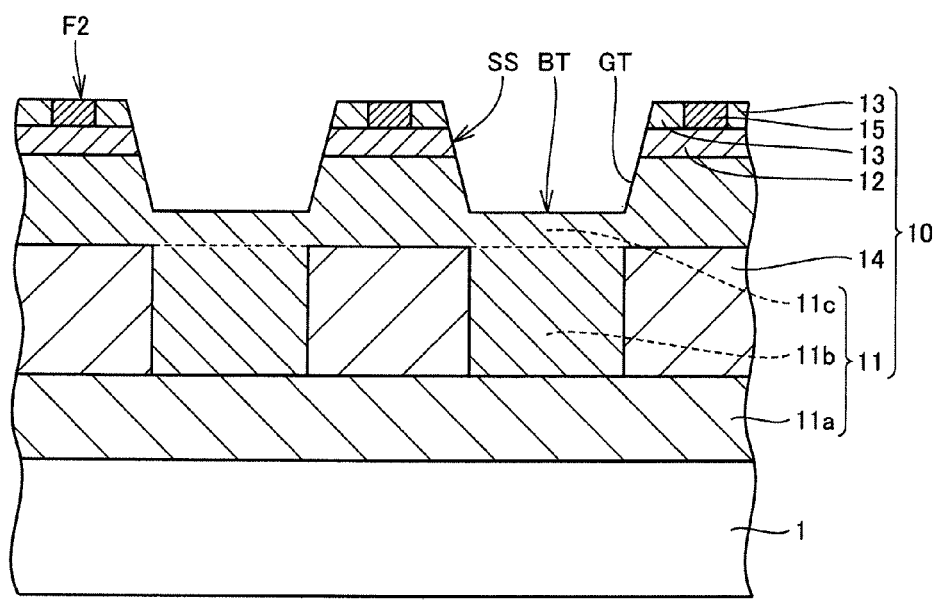

As shown in FIG. 19, $p^+$ contact region 15 is formed by impurity ion implantation. Then, activation annealing is carried out to activate the impurities implanted by ion implantation. For example, heating is carried out at the temperature of 1700° C. for 30 minutes.

Figure 20:
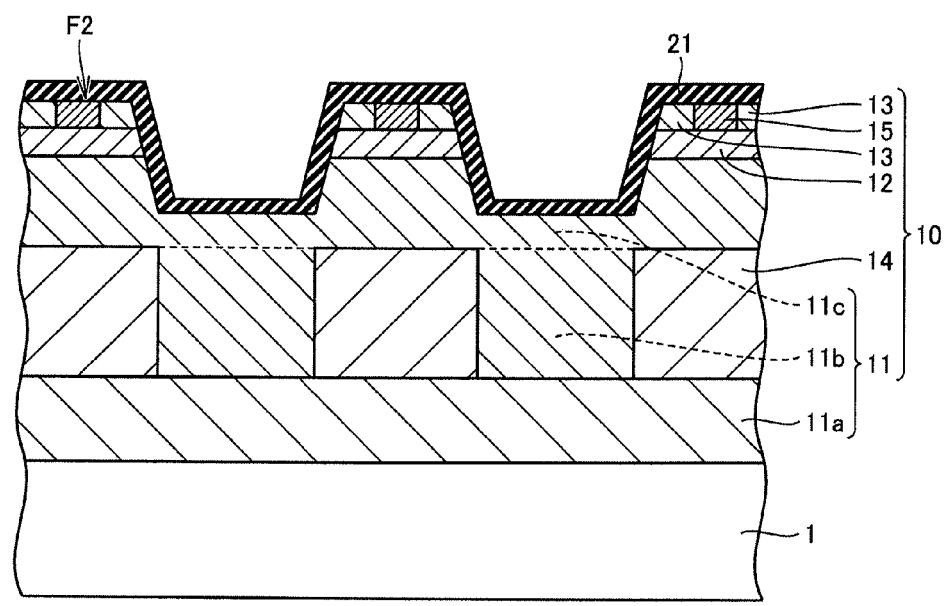

As shown in FIG. 20, the exposed face of SiC layer 10 is subjected to thermal oxidation to form gate oxide film 21. Since the inner face of gate trench GT is subjected to thermal oxidation during this step, gate oxide film 21 covers p region 12 of SiC layer 10 on sidewall SS.

Figure 21:
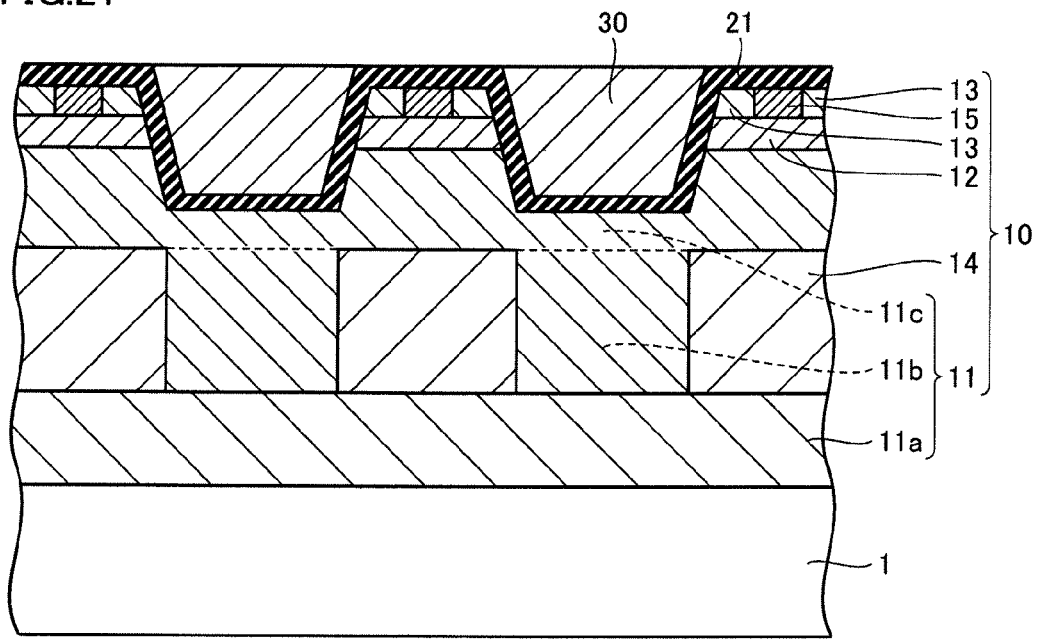

As shown in FIG. 21, gate electrode 30 is formed on gate oxide film 21 in gate trench GT. Gate electrode 30 is formed to have a portion located on p region 12 of SiC layer 10 with gate oxide film 21 therebetween.

Figure 22:
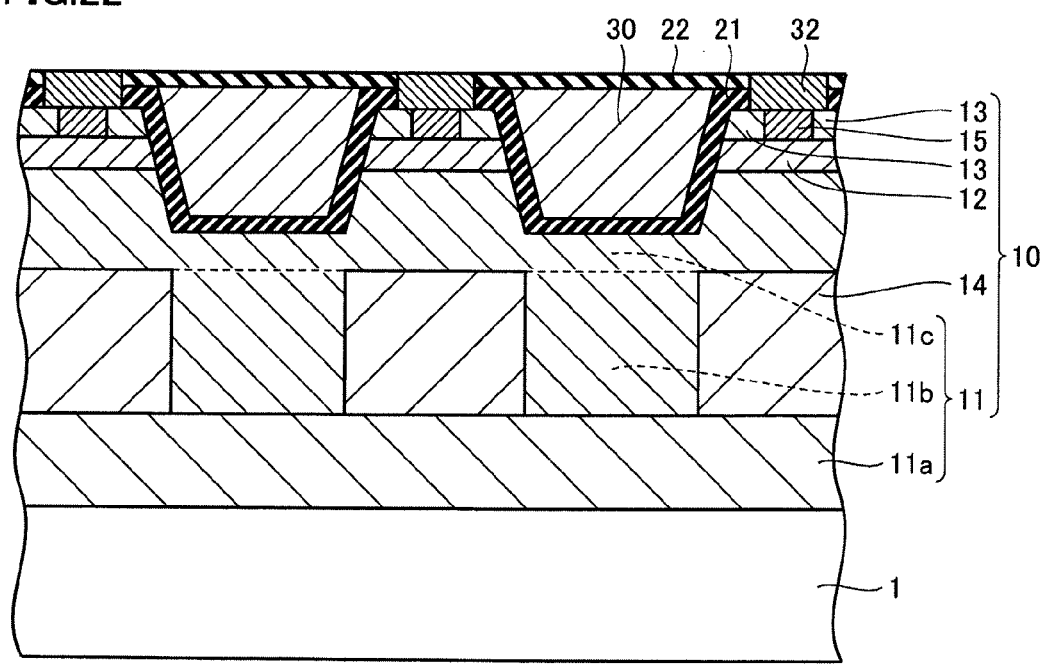

Referring to FIG. 22, interlayer insulation film 22 is formed on exposed gate oxide film 21 and gate electrode 30 (FIG. 21). Then, gate oxide film 21 and interlayer insulation film 22 are subjected to patterning to form an opening exposing $p^+$ contact region 15 and n region 13 partially. Then, source electrode 32 is formed in this opening. Thus, the structure shown in FIG. 22 is obtained.

Referring to FIG. 1 again, source interconnection layer 33 is formed on interlayer insulation film 22 and source electrode 32. Further, drain electrode 31 is formed on $n^-$ drift region 11, i.e. on lower face F1 of SiC layer 10, with single crystal substrate 1 therebetween. Thus, MOSFET 100 is obtained.

Thermal etching employed in the above-described manufacturing method will be set forth below. Thermal etching is based on chemical reaction occurring by supplying process gas including reactive gas to an etching target heated up to a predetermined thermal treatment temperature.

For the reactive gas in the process gas, gas containing chlorine atoms, preferably chlorine based gas, more preferably chlorine gas, is employed. Thermal etching is preferably carried out under an atmosphere in which the partial pressure of the chlorine based gas is less than or equal to 50%. The process gas preferably includes oxygen atoms, for example, oxygen gas. In the case where chlorine gas and oxygen gas are both employed, the ratio of the flow rate of oxygen gas to the flow rate of chlorine gas is preferably greater than or equal to 0.1 and less than or equal to 2.0, more preferably the lower limit of this ratio is 0.25, in supplying process gas. Further, the process gas may include carrier gas. For the carrier gas, nitrogen gas, argon gas, helium gas, or the like, for example, may be employed. Thermal etching is carried out preferably under reduced pressure, and more preferably, the pressure is less than or equal to 1/10 the pressure of the atmosphere.

The thermal treatment temperature is preferably greater than or equal to 700° C., more preferably greater than or equal to 800° C., and further preferably greater than or equal to 900° C. Accordingly, the etching rate can be increased. Furthermore, the thermal treatment temperature is preferably less than or equal to 1200° C., more preferably less than or equal to 1100° C., and further preferably less than or equal to 1000° C. Accordingly, the device used for thermal etching can be a simpler one. For example, a device using a quartz member may be employed.

Mask layer 71 for thermal etching (FIG. 17) is preferably made of silicon oxide. Accordingly, the consumption of the mask during etching can be suppressed.

By the thermal etching set forth above, a crystal plane having high chemical stability and crystallographically specific can be provided in self-formation as sidewall SS (FIG. 2) of gate trench GT. The crystal plane formed may include at least one of a {0-33-8} plane and {0-11-4} plane when the crystal structure of SiC layer 10 corresponds to the hexagonal system. When the crystal structure thereof corresponds to the cubic system, the crystal plane may include the {100} plane.

The method of using MOSFET 100 (FIG. 1) and the functional effect of the present embodiment will be described hereinafter.

MOSFET 100 is used as a switching element for switching the current path between drain electrode 31 and source interconnection layer 33. A positive voltage relative to source interconnection layer 33 is applied to drain electrode 31. When a positive voltage greater than or equal to the threshold voltage is applied to gate electrode 30, an inversion layer is present at p region 12 on sidewall SS of gate trench GT, i.e. at the channel region. Therefore, $n^-$ drift region 11 is electrically connected to n region 13, which is an ON state of MOSFET 100.

When application of a voltage greater than or equal to the threshold voltage to gate electrode 30 is stopped, the aforementioned inversion layer is eliminated. Therefore, carrier supply from source interconnection layer 33 towards $n^-$ drift region 11 is stopped. As a result, depletion proceeds from the pn junction plane by $n^-$ drift region 11 and p region 12 towards drain electrode 31. Thus, $n^-$ drift region 11 and charge compensation region 14 are depleted.

The positive fixed charge of depleted $n^-$ drift region 11 becomes a factor in increasing the electric field intensity in the thickness direction on the pn junction plane. Depleted charge compensation region 14 has negative fixed charge, which cancels at least a portion of the aforementioned electric field intensity. In other words, charge compensation region 14 functions as a charge compensation structure. Accordingly, the maximum value of the electric field intensity in the thickness direction is suppressed. Thus, the breakdown voltage of MOSFET 100 can be improved.

Charge compensation region 14 (FIG. 2) has a thickness TH preferably greater than 5 µm in thickness direction DD. Accordingly, the charge compensation structure is provided over a larger range in thickness direction DD. Thus, the breakdown voltage of MOSFET 100 can be further improved.

During formation of through portion PP (FIG. 9) in charge compensation region 14, etching having a physical etching action is preferably employed. Accordingly, the etching directed to forming through portion PP can be carried out more perpendicularly. Therefore, side face SD (FIG. 2) of charge compensation region 14 constituting the inner face of through portion PP can be set along thickness direction DD. Thus, the charge compensation by virtue of charge compensation region 14 can be effected more sufficiently.

Charge compensation region 14 (FIG. 1) is located away from p region 12. Therefore, the event of the impurities in charge compensation region 14 affecting p region 12 functioning as a channel can be avoided.

In the present embodiment, thermal etching is employed in forming gate trench GT. Accordingly, the plane orientation of sidewall SS of gate trench GT can be provided in self-formation as a crystallographically specific one. Preferably, sidewall SS of gate trench GT is oblique by just an angle AF (FIG. 2) greater than 0° and smaller than 90°, relative to upper face F2 of SiC layer 10. Accordingly, a channel plane having a plane orientation oblique to upper face F2 can be provided on sidewall SS of gate trench GT. More preferably, the angle of side face SD (FIG. 2) of charge compensation region 14 relative to thickness direction DD is smaller than angle AD of sidewall SS of gate trench GT relative to thickness direction DD. Accordingly, the charge compensation by virtue of charge compensation region 14 can be effected more sufficiently.

SiC layer 10 may have a crystal structure of hexagonal system. In this case, sidewall SS of gate trench GT of SiC layer 10 preferably includes a region constituted of at least one of the {0-33-8} plane and {0-11-4} plane. Accordingly, the carrier mobility on sidewall SS can be increased. Therefore, the ON resistance of MOSFET 100 can be suppressed.

SiC layer 10 may have a crystal structure of cubic system. In this case, sidewall SS of gate trench GT of SiC layer 10 preferably includes a region constituted of the {100} plane. Accordingly, the carrier mobility on sidewall SS can be increased. Therefore, the ON resistance of MOSFET 100 can be suppressed.

In the present embodiment, the cross section of gate trench GT (FIG. 2) is, but not limited to, a trapezoidal shape. For example, it may be a V shape. In other words, the bottom of the gate trench does not necessarily have to be a flat plane.

Further, gate trench GT may be formed by dry etching, other than thermal etching. For example, gate trench GT may be formed by RIE or IBE, for example. Moreover, gate trench GT may be formed by etching other than dry etching, for example, by wet etching. The sidewalls of the gate trench facing each other do not necessarily have to be in a non-parallel position relationship, as shown in FIG. 1. The sidewalls may take a parallel relationship with respect to each other.

Figure 4:
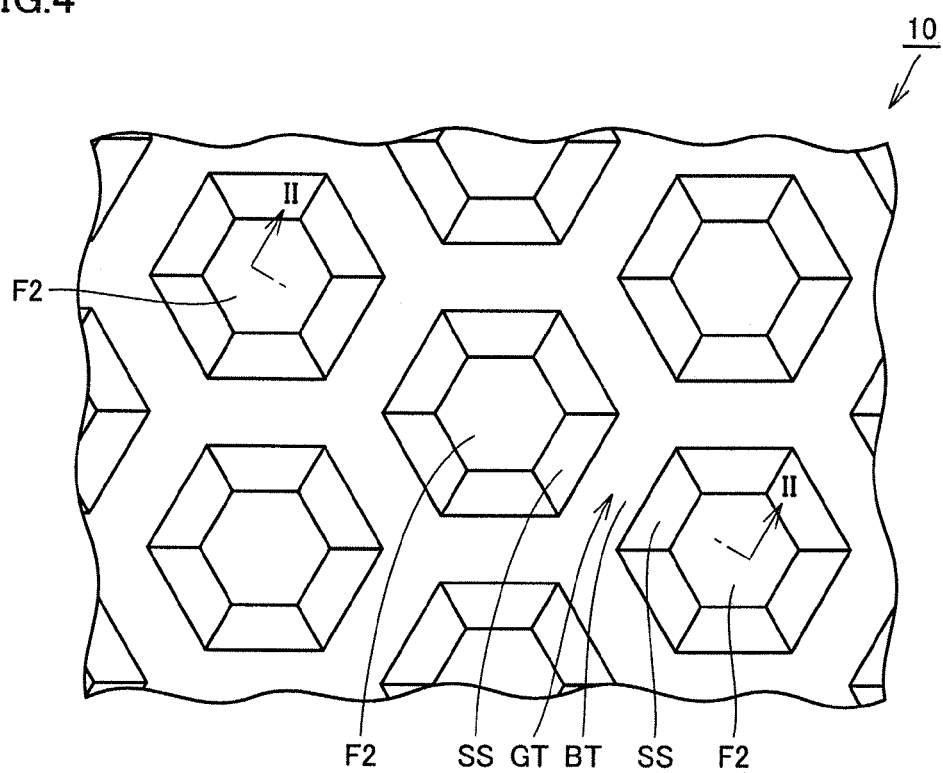
Figure 5:
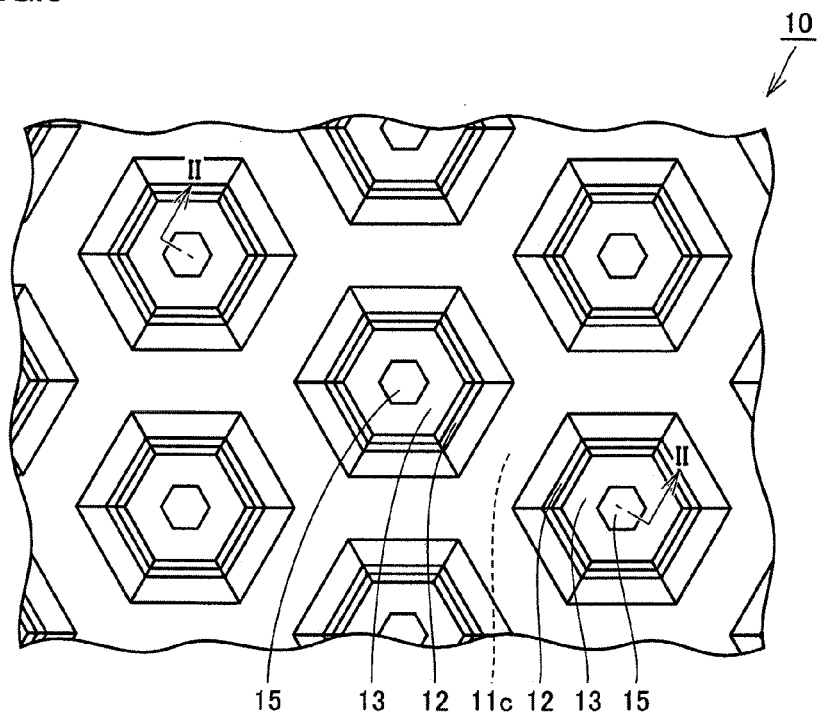
FIG. 5 is a partial plan view showing in further detail a configuration of the silicon carbide layer in FIG. 4.

In the embodiment set forth above, the region of upper face F2 surrounded by sidewall SS of gate trench GT has a hexagonal shape, as shown in FIG. 4. The shape of this region is not limited to a hexagon, and may be a rectangle (including a square), for example. For this shape, a hexagon in which each corner has an angle of approximately 60° is preferable when the crystal structure of SiC layer 10 is hexagonal. In the case where the crystal structure is cubic, a rectangle is preferable.

Second Embodiment

Figure 23:
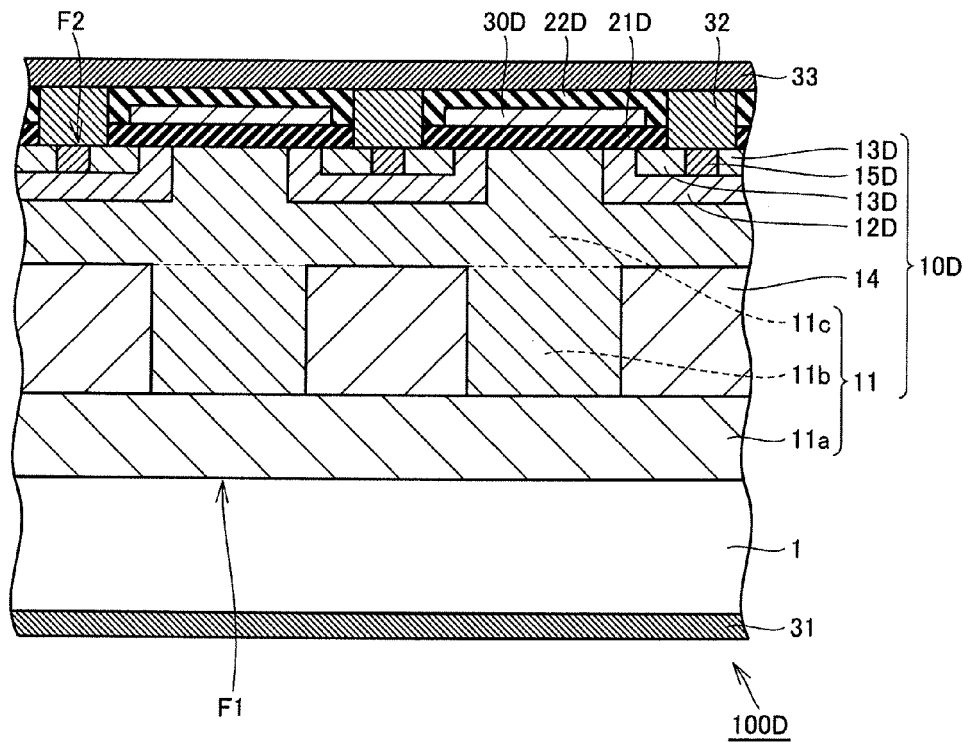
FIG. 23 is a partial sectional view schematically representing a configuration of a silicon carbide semiconductor device according to a second embodiment of the present invention.

As shown in FIG. 23, an MOSFET 100D includes a single crystal substrate 1, a SiC layer 10D, a drain electrode 31, a source electrode 32, a gate oxide film 21D, an interlayer insulation film 22D, a gate electrode 30D, and a source interconnection layer 33.

Figure 24:
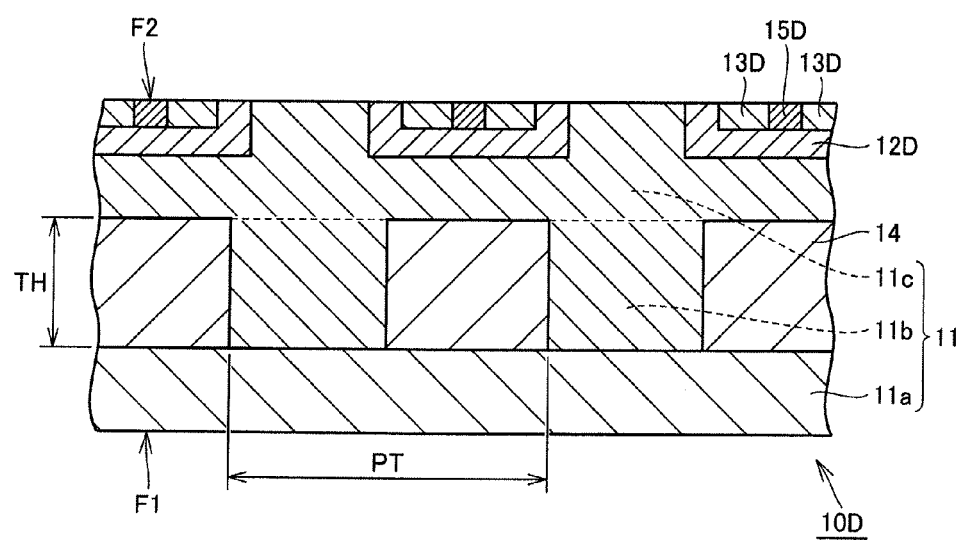
FIG. 24 is a partial sectional view schematically representing a configuration of a silicon carbide layer in the silicon carbide semiconductor device of FIG. 23.

Referring to FIG. 24, SiC layer 10D has a lower face F1 (first surface) and an upper face F2 (second surface) opposite to each other in the thickness direction (vertical direction in the drawing). SiC layer 10D includes an n$^-$ drift region 11 (first region), a p region 12D (second region), an n region 13D (third region), a charge compensation region 14 (fourth region), and a p$^+$ contact region 15D. P region 12D is provided on a cover portion 11c of n$^-$ drift region 11, and is of the p-type (second conductivity type differing from the first conductivity type). N region 13D is formed on p region 12D, isolated from n$^-$ drift region 11 by p region 12D, and is of the n-type (first conductivity type). P$^+$ contact region 15D is directly provided on a portion of p region 12D, constituting a portion of upper face F2 of SiC layer 10D.

P region 12D is located away from charge compensation region 14. Specifically, p region 12D is isolated from charge compensation region 14 by cover portion 11c of n$^-$ drift region 11.

Gate oxide film 21D is provided on upper face F2 of SiC layer 10D, above p region 12D to connect n$^-$ drift region 11 with n region 13D. Specifically, gate oxide film 21D covers p region 12D on upper face F2 of SiC layer 10D. Gate electrode 30D is provided on gate oxide film 21D. Accordingly, gate electrode 30D is located on p region 12D of SiC layer 10D with gate oxide film 21D therebetween.

Source electrode 32 is directly provided on n region 13D and p$^+$ contact region 15D of SiC layer 10D.

SiC layer 10D may have a crystal structure of hexagonal system. In this case, upper face F2 of SiC layer 10D preferably includes a region constituted of at least one of the {0-33-8} plane and {0-11-4} plane. SiC layer 10D may have a crystal structure of cubic system. In this case, upper face F2 of SiC layer 10D preferably includes a region constituted of the {100} plane.

Elements in the structure other than those set forth above are substantially identical to those of the first embodiment set forth above. The same or corresponding elements have the same reference characters allotted, and description thereof will not be repeated.

A method for manufacturing MOSFET 100D will be described hereinafter. First, steps similar to those shown in FIGS. 6-11 of the first embodiment are carried out.

Figure 25:
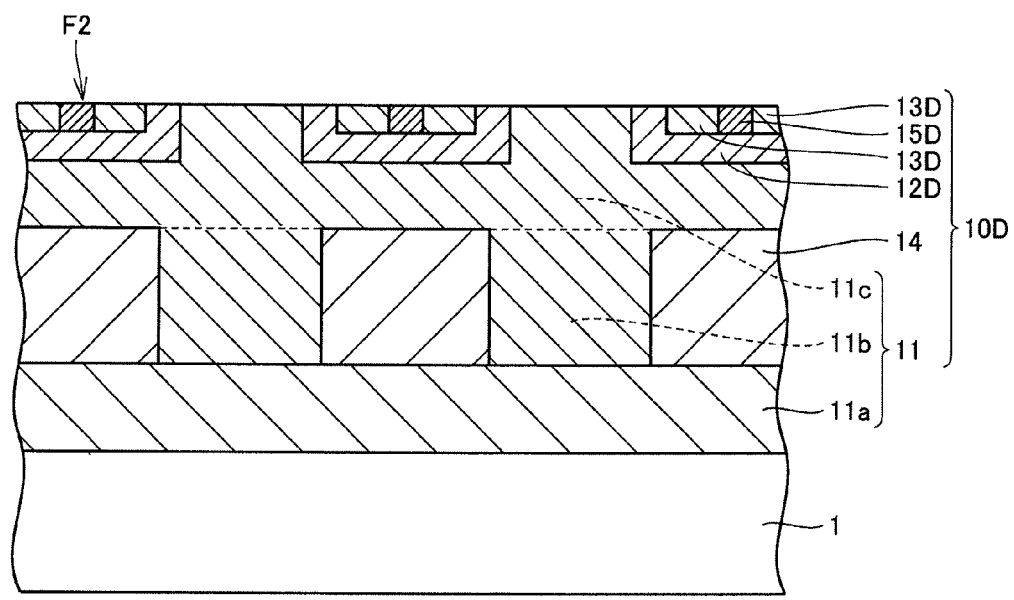
FIGS. 25 and 26 are partial sectional views schematically representing first and second steps, respectively, in the method for manufacturing a silicon carbide semiconductor device according to the second embodiment of the present invention.

As shown in FIG. 25, p region 12D, n region 13D and p$^+$ contact region 15D are formed on cover portion 11c of n$^-$ drift region 11 by impurity ion implantation. Then, activation annealing is carried out to activate the impurities implanted by ion implantation. For example, heating is carried out at the temperature of 1700° C. for 30 minutes. Accordingly, SiC layer 10D is formed on single crystal substrate 1.

Figure 26:
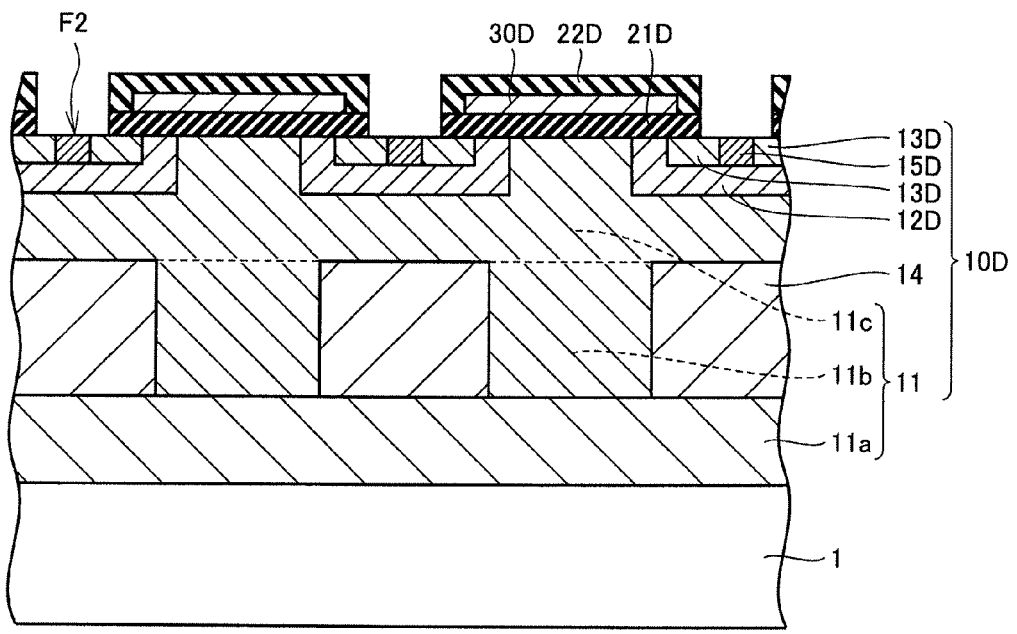

Referring to FIG. 26, gate oxide film 21D is formed by thermal oxidation on upper face F2 of SiC layer 10D. Accordingly, p region 12D is covered with gate oxide film 21D. Gate electrode 30D is formed on gate oxide film 21D. Gate electrode 30D is formed to have a portion located above p region 12D of SiC layer 10D with gate oxide film 21D therebetween. Interlayer insulation film 22 is formed on the exposed gate oxide film 21D and gate electrode 30D. By gate oxide film 21D and interlayer insulation film 22D being subjected to patterning, an opening is formed, exposing p$^+$ contact region 15D and a portion of n region 13D. Then, source electrode 32 is formed in this opening. Thus, the configuration shown in FIG. 26 is obtained.

Referring to FIG. 23 again, source interconnection layer 33 is formed on interlayer insulation film 22D and source electrode 32. Further, drain electrode 31 is formed on n$^-$ drift region 11, i.e. on lower face F1 of SiC layer, with single crystal substrate 1 therebetween. Thus, MOSFET 100D is obtained.

In the method for manufacturing MOSFET 100 (FIG. 1) or MOSFET 100D (FIG. 23) in the embodiments set forth above, a step of removing single crystal substrate 1 may be carried out, prior to formation of drain electrode 31. In this case, MOSFET 100 (FIG. 1) is absent of single crystal substrate 1, and drain electrode 31 is directly provided on n$^-$ drift region 11, i.e. on lower face F1.

The first conductivity type is not limited to the n-type, and may be the p-type. The MOSFET is of the n channel type when the first conductivity type is the n-type, and is of the p channel type when the first conductivity type is the p-type.

Moreover, the silicon carbide semiconductor device is not limited to an MOSFET, and may be an MISFET (Metal Insulator Semiconductor Field Effect Transistor) other than an MOSFET.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A silicon carbide semiconductor device comprising:
   a silicon carbide layer having a first surface and a second surface opposite to each other in the thickness direction, said silicon carbide layer including a first region constituting said first surface and of a first conductivity type, a second region provided on said first region so as to be apart from said first surface by said first region, and of a second conductivity type differing from said first conductivity type, a third region provided on said second region, isolated from said first region by said second region, and of said first conductivity type, and a fourth region provided in said first region, located away from each of said first surface and said second region, and of the second conductivity type, and
   a gate insulation film provided on said second region to connect said first region with said third region,
   a gate electrode provided on said gate insulation film,
   a first electrode provided beneath said first region, and
   a second electrode provided on said third region,
   wherein the first region includes a base portion on the side of the first surface and a cover portion on the side of the second region, the base portion and said cover portion are disposed apart from each other in the thickness direction, and the fourth region is disposed between the base portion and the cover portion.

2. The silicon carbide semiconductor device according to claim 1, wherein said fourth region has a thickness greater than 5 μm in said thickness direction.

3. The silicon carbide semiconductor device according to claim 1, wherein a gate trench having a sidewall is provided at said second surface, passing through said third region and said second region up to said first region, and located away from said fourth region, and said gate insulation film is provided on said sidewall.

4. The silicon carbide semiconductor device according to claim 3, wherein said sidewall of said gate trench is oblique to said second surface of said silicon carbide layer by an angle greater than 0° and smaller than 90°.

5. The silicon carbide semiconductor device according to claim 4, wherein an angle of a side face of said fourth region relative to said thickness direction is smaller as compared to an angle of said sidewall of said gate trench relative to said thickness direction.

6. The silicon carbide semiconductor device according to claim 1, wherein said silicon carbide layer has a crystal structure of hexagonal system, and said sidewall of said gate trench in said silicon carbide layer includes a region constituted of at least one of a {0-33-8} plane and {0-11-4} plane.

7. A silicon carbide semiconductor device comprising:
   a silicon carbide layer having a first surface and a second surface opposite to each other in the thickness direction, said silicon carbide layer including a first region on the side of said first surface and of a first conductivity type, a second region provided on said first region so as to be apart from said first surface by said first region, and of a second conductivity type different from said first conductivity type, a third region provided on said second region, isolated from said first region by said second region, and of said first conductivity type, and fourth regions provided in said first region, located away from each of said first surface and said second region, and of the second conductivity type, said first region including a base portion on the side of said first surface, a cover portion on the side of said second region, an embedding portion between said base portion and said cover portion, and a trench, said embedding portion being disposed between said fourth regions adjacent with each other, said trench being disposed above said embedding portion;
   a gate insulation film provided on a surface of said trench and lying over said first region, said second region, and said third region;
   a gate electrode provided on said gate insulation film;
   a first electrode provided beneath said first region; and
   a second electrode provided on said third region.

8. The silicon carbide semiconductor device according to claim 7,
   wherein plural trenches are provided, a distance between said fourth regions adjacent with each other and a distance between said trenches adjacent with each other are substantially the same.

* * * * *